(12) United States Patent
Zaitsu et al.

(10) Patent No.: US 9,007,838 B2
(45) Date of Patent: Apr. 14, 2015

(54) SEMICONDUCTOR INTEGRATED CIRCUIT HAVING A PERMANENTLY CONDUCTIVE NON-VOLATILE MEMORY ELEMENT

(71) Applicant: Kabushiki Kaisha Toshiba, Tokyo (JP)

(72) Inventors: Koichiro Zaitsu, Kanagawa (JP); Kosuke Tatsumura, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 109 days.

(21) Appl. No.: 13/776,377

(22) Filed: Feb. 25, 2013

(65) Prior Publication Data

US 2014/0061765 A1    Mar. 6, 2014

(30) Foreign Application Priority Data

Sep. 5, 2012  (JP) ................. 2012-195285

(51) Int. Cl.
*G11C 11/40* (2006.01)
*H01L 29/792* (2006.01)
*H01L 29/788* (2006.01)
*H01L 27/115* (2006.01)
*H01L 27/118* (2006.01)
*G11C 16/10* (2006.01)

(52) U.S. Cl.
CPC .......... *H01L 29/792* (2013.01); *H01L 29/7881* (2013.01); *H01L 27/11526* (2013.01); *H01L 27/11573* (2013.01); *H01L 27/11803* (2013.01); *G11C 16/10* (2013.01)

(58) Field of Classification Search
CPC ...................................... H01L 29/792
USPC .............. 257/324, 50, 316, 390; 365/185.01, 365/185.05, 104, 154, 189.29; 438/257, 438/228, 424; 326/41
See application file for complete search history.

(56) References Cited

U.S. PATENT DOCUMENTS

| 4,112,509 | A  | * | 9/1978  | Wall ........................ 365/185.29 |
| 4,151,021 | A  | * | 4/1979  | McElroy ....................... 438/257 |
| 4,758,745 | A  |   | 7/1988  | Elgamal et al. |
| 5,413,944 | A  | * | 5/1995  | Lee ............................... 438/228 |
| 5,682,107 | A  | * | 10/1997 | Tavana et al. ................... 326/41 |
| 5,812,450 | A  | * | 9/1998  | Sansbury et al. ......... 365/185.01 |
| 6,184,105 | B1 | * | 2/2001  | Liu et al. ....................... 438/424 |
| 7,897,967 | B2 | * | 3/2011  | Ito et al. ......................... 257/50 |

* cited by examiner

*Primary Examiner* — Jerome Jackson, Jr.
*Assistant Examiner* — Younes Boulghassoul
(74) *Attorney, Agent, or Firm* — Patterson & Sheridan, LLP

(57) ABSTRACT

A semiconductor integrated circuit includes a transistor with a source region, a drain region, and a control gate electrode. The integrated circuit additionally includes a controller that selectively applies voltages to the control gate of the transistor. The controller may apply a first voltage that forms a permanent conductive path between the source and drain of the transistor.

14 Claims, 18 Drawing Sheets

SEMICONDUCTOR INTEGRATED CIRCUIT HAVING A PERMANENTLY CONDUCTIVE NON-VOLATILE MEMORY ELEMENT

CROSS-REFERENCE TO RELATED APPLICATION

This application is based upon and claims the benefit of priority from Japanese Patent Application No. 2012-195285, filed Sep. 5, 2012; the entire contents of which are incorporated herein for reference.

FIELD

Embodiments described herein relate generally to semiconductor integrated circuits and programmable logic devices.

BACKGROUND

A programmable logic device is a semiconductor integrated circuit that allows a circuit to be reconfigured (or first configured) after it has been manufactured. A Field Programmable Gate Array (FPGA) is a representative example of a programmable logic device.

The programmable logic device has multiple wirings and to rewrite the circuit, the wirings may be selectively connected or disconnected electrically to each other. Several methods exist to control or alter the various possible connections.

One method of controlling the wiring connections utilizes transistors and memory. The memory is programmable electrically and the transistors are switched on or off based on programmed information stored in the memory. In general, SRAM is used as memory in these devices.

Another method of controlling the wiring connections is to install an anti-fuse with two terminals between multiple wirings. An "anti-fuse" as used here is a device component that generally does not conduct electricity until some short-circuiting voltage level is exceeded, after which the component becomes conductive even at voltage levels below the short-circuiting voltage. An anti-fuse component may include an insulating film, such as amorphous silicon, inserted between two terminals. There is a high resistance between the terminals initially. Therefore, the terminals are, effectively, electrically disconnected. However, when a specified voltage is applied between the terminals, or a specified current flows between the terminals, the insulating film is broken (altered) and the terminals are short-circuited. Thus, the multiple wirings connected to the terminals electrically connect to each other.

Since the change in the resistance in the anti-fuse is irreversible, the wiring once connected may not be returned to the disconnected state. Therefore, even in such unusual or harsh environments as under the strong influence of cosmic rays, or under high temperature, the circuit information fixed by anti-fuse will not be lost as might be the case when connections are based on information stored in an electronic memory, such as an SRAM. However, with a programmable logic device utilizing an anti-fuse, once the circuit information is fixed, it cannot be changed later. Thus, the utility of the programmable logic device is reduced.

On the other hand, a programmable logic device utilizing transistors and memory allows users to rewrite the circuit by rewriting the memory multiple times. However, if information stored in the memory is lost due to an external cause, the programmable logic device may malfunction. Therefore, it is not appropriate to be used in an unusual or harsh environment.

DETAILED DESCRIPTION

Figure 1A:
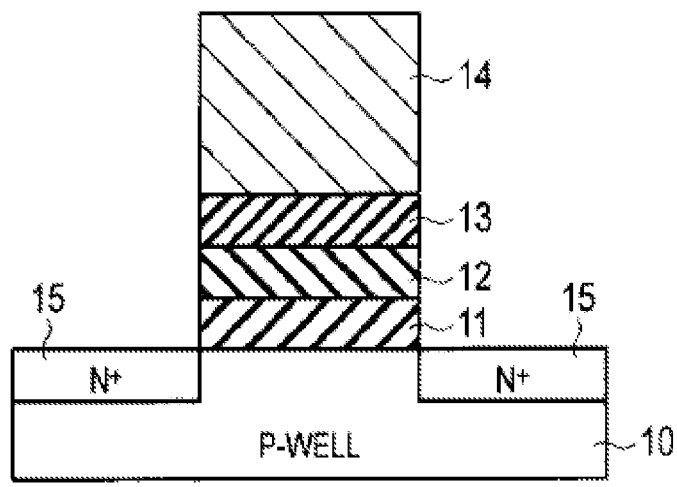
FIG. 1A depicts a non-volatile memory transistor.

The present disclosure describes an integrated circuit device with increased circuit stability useful, for example, in a programmable logic device requiring multiple circuit reconfigurations. In general, an example embodiment is described below by referring to the figures.

A semiconductor integrated circuit, according to a first embodiment, includes: a plurality of transistors including a first transistor, each of the transistors being formed in a well of a first conductivity and including a source region of a second conductivity type disposed in the well, the second conductivity type different from the first conductivity type, a drain region of the second conductivity disposed in the well, a channel region disposed between the source region and the drain region, a first insulating film disposed on the channel region, and a control gate electrode disposed on the first insulating film; and a controller configured to apply a first voltage to the control gate electrode of the first transistor in the plurality of transistors, the first voltage forming a permanent conductive path between the source region and the drain region of the first transistor when a second voltage is applied to the source region and the drain region.

A semiconductor integrated circuit, according to a second embodiment, includes: a plurality of memory units each including a first memory transistor, the first memory transistor formed in a well of a first conductivity and having a source region of a second conductivity type disposed in the well, the second conductivity type different from the first conductivity type, a drain region of the second conductivity disposed in the well, a channel region disposed between the source region and the drain region, a first insulating film disposed on the channel region, a charge storage film disposed on the first insulating film, a second insulating film disposed on the charge storage film, and a control gate electrode disposed on the second insulating film; and a controller configured to apply a first voltage to the control gate electrode of the first memory transistor of a selected memory unit in the plurality of memory units, the first voltage placing the first memory transistor in an erase state, and to apply a second voltage to the control gate electrode of the first memory transistor of the selected memory unit, the second voltage forming a permanent conductive path between the source region and the drain region of the first memory transistor when a third voltage is applied to the source region and drain region.

A semiconductor integrated circuit according to a third embodiment includes a plurality of memory units and a controller. Each memory unit includes a first memory transistor formed in a well of a first conductivity type (P type or N type) having a source region of a second conductivity type (N type or P type) disposed in the well. The well may be an entire semiconductor substrate or a portion thereof. Additionally, the first conductivity type and the second conductivity type are not the same. Each memory transistor includes a drain region of the second conductivity disposed in the well and a channel region disposed between the source region and the drain region. A first insulating film is disposed on the channel region; a charge storage film disposed on the first insulating film; and a second insulating film disposed on the charge storage film. A control gate electrode is disposed on the second insulating film. The controller is configured to apply a first voltage to the control gate electrode of the first memory transistor of a selected memory unit in the plurality of memory units, the first voltage placing the first memory transistor in an erase state, and to apply a second voltage to the control gate electrode of the first memory transistor of the selected memory unit, the second voltage forming a permanent conductive path between the source region and the drain region of the first memory transistor when a third voltage is applied to the source region and drain region.

A semiconductor integrated circuit according to a fourth embodiment includes a semiconductor substrate with at least a portion having a first conductivity type. The circuit includes memory units, logic transistors, and a controller. Each memory unit includes at least one memory transistor. The controller is a circuit that can selectively apply voltages to a control gate electrode of a memory transistor within a memory unit, for example an erase voltage, a write voltage, or a short-circuit voltage. The erase and write voltages are used to store data in the memory transistors. The short-circuit voltage is used to permanently alter the conductivity across a selected memory transistor, thereby, in effect, storing data in an irreversible manner in the selected memory transistor.

Each memory transistor generally includes a source region and a drain region of a second conductivity type, different from the first conductivity type. The source and drain regions (impurity regions) of the memory transistor are formed by impurity doping (with a second conductivity type dopant) in a portion or portions of the substrate. The memory transistor includes a channel region between the source region and the drain region. A first insulating film is formed above the channel. A charge storage film is formed on the first insulating film. A second insulating film is formed on the charge storage film. A control gate electrode is formed on the second insulating film.

When the controller applies selectively the erase voltage to the control gate of a first memory transistor, the first memory transistor can be placed in an erase state. When the first memory transistor having N type source/drain regions in a P type well is in the erase state, a relatively small number of electrons are stored in the charge storage film and thus the threshold voltage of the first memory transistor is low.

When the controller applies selectively the write voltage to the control gate of the first memory transistor, the first memory transistor can be placed in a written (write) state. When the first memory transistor having N type source/drain regions in a P type well is in the write state, a relatively large number of electrons are stored in the charge storage film and thus the threshold voltage of the first memory transistor is high.

When the controller applies selectively the short-circuit voltage to the control gate of the first memory transistor, the first memory transistor can be placed in a permanently conductive state (a shorted state) by causing a breakdown of the PN junctions of the source-channel-drain regions.

Write, erase, and short-circuit operations generally also require a voltage (a third voltage) to be applied to the source/drain regions of the memory transistor being written, erased, or permanently altered by short-circuiting. When the first conductivity type is P type and the second conductivity type is N type, this third voltage is greater than the short-circuit voltage. When the first conductivity type is N type and the second conductivity type is P type, the third voltage is smaller than the second voltage.

(Circuit Configuration)

The semiconductor integrated circuit according to an example embodiment includes multiple memory units, multiple logic transistors, and at least one controller. Each memory unit includes at least one memory transistor. Here, each memory transistor is formed in a well of a first conductivity type in a semiconductor substrate. Furthermore, the memory transistor includes: two impurity regions (source and drain) having a second conductivity type, which is different from the first conductivity type, formed inside the well; a channel region between the two impurity regions; a first insulating film on the channel region; a charge storage film on the first insulating film; a second insulating film on the charge storage film; and a control gate electrode on the second insulating film.

The multiple memory units include a first memory transistor. The controller selectively applies various voltages to the control gate of the first memory transistor, such as a first voltage that places the memory transistor in an erase state (relatively low charge level in the charge storage film), and a second voltage that forms a permanent conductivity path between the two impurity regions of the first memory transistor.

When the second voltage is applied to the control gate of the first memory transistor, the two impurity regions of the first memory transistor are set at a third voltage. At this time, the well of the first memory transistor is preferably made to be floating electrically.

The third voltage is a voltage that satisfies the following conditions: when the first conductivity type is P type and the second conductivity type is N type, the third voltage is greater than the second voltage; when the first conductivity type is N type and the second conductivity type is P type, the third voltage is smaller than the second voltage. In other words, if the second voltage is applied to the well and the third voltage is applied to the two impurity regions, a reverse bias voltage is applied to a PN junction of the two impurity regions and the well.

In this way, for example, reconfiguration of the circuit according to the threshold voltage (writing/erasing) of the first memory transistor becomes possible. Also, if it is desired to improve the stability of circuit activities, the circuit may be fixed by forming a permanent conductive path between the two impurity regions of the first memory transistor.

When forming this permanent conductive path, the second voltage is applied to the control gate of the first memory transistor and the potential in the channel region is modulated by capacitive coupling between the control gate and the channel region. Also, the third voltage is applied to the two impurity regions so as to make the relationship between this channel region where voltage is modulated and the two impurity regions of the first memory transistor in a reverse-bias condition.

Thus, with this voltage relationship, the circuit may be fixed by destroying the PN junction formed by the two impurity regions of the first memory transistor and the channel region.

The controller may also selectively apply a fourth voltage, which places the first memory transistor in the write state (relatively high charge level in the charge storage film), to the control gate of the first memory transistor.

When the first conductivity type is P type and the second conductivity type is N type, the first voltage is greater than the second voltage and the fourth voltage is greater than the first voltage. On the other hand, when the first conductivity type is N type and the second conductivity type is P type, the first voltage is smaller than the second voltage and the fourth voltage is smaller than the first voltage. The third voltage is preferably a ground voltage.

Before a permanent conductive path is formed between the two impurity regions, it is preferable that the first memory transistor is in an off state. In other words, the threshold voltage of the first memory transistor is preferably greater than 0 V when the first conductivity type is P type and the second conductivity type is N type; and less than 0 V when the first conductivity type is N type and the second conductivity type is P type. For example, the impurity (dopant) concentration in the channel region of the first memory transistor may be adjusted so that the threshold voltage always satisfies conditions above even when the first memory transistor is in the write or erase state.

The multiple memory units, the multiple logic transistors, and the controller can be arranged in one chip. However, the first and second voltages may be supplied from outside the chip to inside the chip, rather than generating those voltages inside the chip.

The first memory transistor is, for example, a nonvolatile memory transistor of Metal-Oxide-Nitride-Oxide-Silicon (MONOS) type and its charge storage film can include, for example, silicon nitride or silicon oxynitride.

Example Embodiment

Figure 1B:
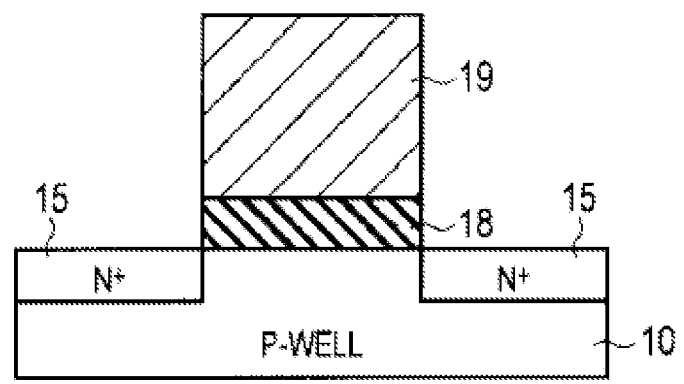
FIG. 1B depicts a logic transistor.

FIG. 1A shows a nonvolatile transistor and FIG. 1B shows a logic transistor.

The nonvolatile memory transistor (hereinafter called memory transistor) is, for example, a flash memory transistor.

The memory transistor includes: an N type impurity region (source and drain) 15 in a P type well 10; a channel region between the N type impurity region 15; a first insulating film 11 on the channel region; a charge storage film 12 on the first insulating film 11; a second insulating film 13 on the charge storage film 12; and a control gate electrode 14 on the second insulating film 13.

The memory transistor stores data using changes in the quantity of charge stored in the charge storage film 12. For the charge storage film 12, a floating gate (e.g. poly-silicon doped in N type or poly-silicon doped in P type), an insulating silicon nitride or silicon oxynitride, or a conductive floating gate to which insulating silicon nitride or silicon oxynitride are layered at its upper part, may be used.

The memory transistor utilizing insulating silicon nitride or silicon oxynitride as the charge storage film 12 is specifically called the memory transistor of the MONOS type. The manufacturing process for a memory transistor of MONOS type is very similar to that for a logic transistor. For example, compared to utilizing a conductive floating gate as the charge storage film 12, the memory transistor of a MONOS type and logic transistor may be located in close proximity. Therefore, in order to minimize the area of chips, it is desirable to use memory transistors of MONOS type.

In the description above, the memory transistor is described as an N type transistor in the P type well 10, but instead, it may be a P type transistor in an N type well. Also, the P type well 10 may be replaced with a P type semiconductor substrate.

Also, the well and semiconductor substrate are, for example, silicon, but semiconductors other than silicon may be used. The first insulating film 11, the charge storage film 12 and the second insulating film 13 and the control gate 14 may be a single layer or may be of a multi-layered construction using varied materials.

The logic transistor is, for example, a field effect transistor (FET). The logic transistor includes: N type impurity regions (source and drain) 15 in an P type well 10; a channel region between the N type impurity region 15; a third insulating film (gate insulating film) 18 on the channel region; and a gate electrode 19 on the third insulating film 18.

The logic transistor does not have a charge storage film between the P type well 10 and the gate electrode 19. For this reason, the distance from the top surface of the P type well (substrate) 10 to the bottom surface of the gate electrode 19 is usually less than that from the top surface of the P type well 10 of memory transistor to the bottom surface of the control gate electrode 14.

For example, in the logic transistor, the distance from the top surface of the P type well 10 to the bottom surface of gate electrode 19 is less than 5 nm. In the memory transistor, the distance from the top surface of the P type well 10 of the memory transistor to the bottom surface of the control gate electrode 14 is, typically, more than 10 nm.

In the description above, the logic transistor is described as an N type transistor in the P type well 10, but instead, it may be a P type transistor in an N type well. Also, the P type well 10 may be replaced with a P type semiconductor substrate.

Also, the well and semiconductor substrate are, for example, silicon, but semiconductors other than silicon may be used. The third insulating film 18 and the gate electrode 19 may be of a single layer or multi-layered construction with varied materials.

The memory transistor in a write state has a relatively large number of electrons stored in the charge storage film 12 and the threshold voltage is therefore high. On the other hand, a memory transistor in an erase state has a relatively small number of electrons stored in the charge storage film 12 and the threshold voltage is therefore low.

Figure 2:
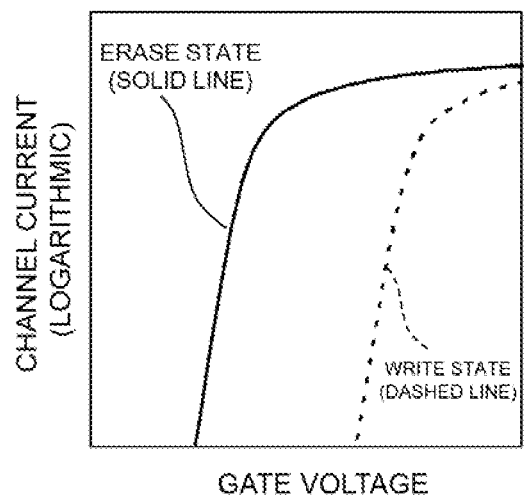
FIG. 2 shows a relationship between a gate voltage and a channel current.

FIG. 2 shows a relationship between the channel current of the memory transistor and the gate voltage of the memory transistor. This figure plots the channel current of the memory transistor in the write/erase state against gate voltage. The solid line represents characteristics in the erase state and the dashed line represents characteristics in the write (written) state. There are typically two methods to make the memory transistors in the write state.

One example is a method in which a large potential difference is created between the control gate and the channel region and data is written using Fowler-Nordheim (FN) current. For example, 20 V is applied to the control gate and the ground voltage (0 V) is applied to the N type impurity regions (source and drain) and to the P type well.

Another example is a method in which the channel hot electron (CHE) is used. In other words, a potential difference is created between the N type impurity region (source) on one side and the control gate and, at the same time, a potential difference is also created between two N type impurity regions (source and drain). For example, 7 V is applied to the control gate and 4 V is applied to the drain and the ground voltage is applied to the source and the P type well.

Figure 3A:
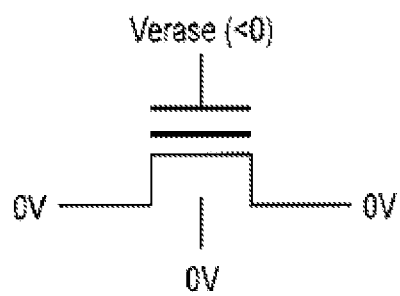
FIG. 3A is an example of an erasing method.
Figure 4A:
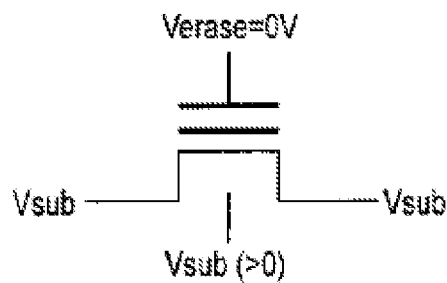
FIG. 4A is another example of an erasing method.
Figure 5A:
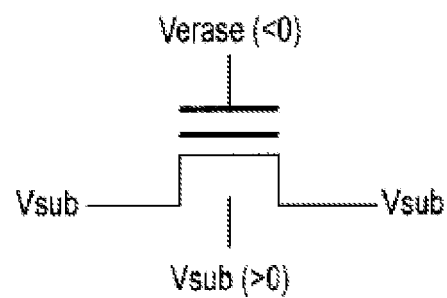
FIG. 5A is another example of an erasing method.

To put the memory transistor in the erase state, the direction of voltage is reversed in the method of writing using FN current as described above. For example, as shown in FIG. 3A, a negative erase voltage Verase (e.g. −20 V) may be applied to the control gate and the ground voltage may be applied to the N type impurity regions (source and drain) and to the P type well. Or, as shown in FIG. 4A, the ground voltage may be applied to the control gate and a positive substrate voltage Vsub (e.g. 20 V) may be applied to the N type impurity regions (source and drain) and to the P type well. Or, as shown in FIG. 5A, a negative erase voltage Verase (e.g., −10 V) may be applied to the control gate and a positive substrate voltage Vsub (e.g., 10 V) may be applied to the N type impurity regions (source and drain) and to the P type well.

However, if a memory transistor and a logic transistor are formed in the same well, it is not desirable to apply a high voltage to the well because the gate insulating film of the logic transistor is generally very thin. Thus, if a high voltage is applied to the well of the logic transistor, the gate insulating film of the logic transistor may be broken.

Taking FIG. 3A, let us consider the case where a negative voltage is applied to the control gate of the memory transistor. When this negative voltage is applied to the control gate, the potential at the channel region is modulated to the negative direction by capacitive coupling between the control gate and the channel region. At this time, if a ground voltage is applied to the well, the potential at the channel region returns to the ground level but there is a period during this transition when the potential in the channel region becomes negative. During this period, if the ground voltage is applied to the source and drain of the memory transistor, then during the transitional period, bias in the reverse direction (reverse bias) is applied to the PN junction between the channel region and the source, or between the channel region and the drain.

In general with PN junctions, current does not flow under the reverse bias. However, when the reverse bias exceeds a certain value, the PN junction is broken (i.e., electrical breakdown is caused) and the rectifying property at the PN junction disappears.

Figure 3B:
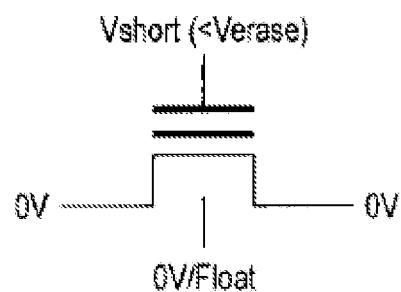
FIG. 3B is an example of a shorting method.

Therefore, as shown in FIG. 3B, under the condition where a ground voltage is applied to the source and drain of the memory transistor, if a negative voltage Vshort is applied to the control gate, then PN junction of the channel region and source, or PN junction of the channel region and drain is broken. In this state, source and drain of the memory transistor are shorted electrically.

The voltage Vshort applied to the control gate to short the source and drain of memory transistor is smaller than the voltage Verase applied to the control gate to place the memory transistor in the erase state.

When the source and drain of the memory transistor are shorted, (hereinafter, the state in which source and drain of memory transistor are shorted is called a shorted state), the current that flows between the source and the drain is roughly constant regardless of gate voltage. In other words, the shorted state can be said to be in a state in which the following formula (1) is satisfied. In the memory transistor before it is made in the shorted state, the threshold voltage in the erase state is Vthe and the threshold voltage in the write state is Vthw. Additionally, when the gate voltage is Vthe and the drain voltage is, for example, 50 mV, the drain current is ID0, and when the gate voltage is Vthw and the drain voltage is, for example, 50 mV, then the drain current is ID1.

$$ID1/ID0 \leq A \qquad (1)$$

A in equation (1) represents the ratio of changes in the drain current. With a normal memory transistor, the drain current ratio for on and off states is more than $10^6$. Therefore, for example, if A=10 and the ratio of ID1 and ID0 is less than 10, the source and drain are considered to be shorted.

The threshold voltage, for example, may be obtained as follows. If 50 mV is applied between the source and the drain of the transistor, then the electric current IDS is measured between the source and the drain while changing the gate voltage. When the channel width of the transistor is W and the channel length is L, the gate voltage at which IDS×L/W becomes 10 nA is defined as threshold voltage.

In this example, it is characterized by the fact that, using the method described above; the memory transistor within the programmable logic device is made in the shorted state. The change to the shorted state is irreversible and the memory transistor once made into the shorted state may not be returned to either the write state or the erase state. Thus, by placing the memory transistor in the shorted state, "on-state" may be maintained permanently thereafter.

In the example of FIG. 3B described above, when the memory transistor is shorted by applying Vshort to the control gate, the ground voltage may be applied to the well, or the potential at the well may be made to float. However, when the potential at the well is made to float, then the potential in the channel region is modulated more efficiently and the absolute value of Vshort may be made smaller, which is preferable.

Figure 6:
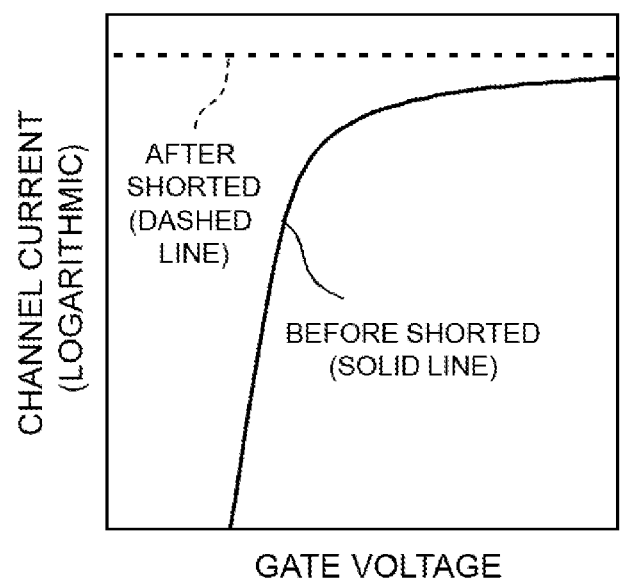
FIG. 6 shows a relationship between the gate voltage and the channel current.

FIG. 6 shows the properties of the memory transistor before and after it is made in the shorted state. The solid line indicates the properties before the memory transistor is made in the shorted state. When the ground voltage is applied to the source and drain of the memory transistor, the well is made to float, Vshort is applied to the control gate, the shorted state is achieved and the properties change to the one shown by the dashed line. Vshort is typically within the range of −25 V to −30 V.

Figure 7A:
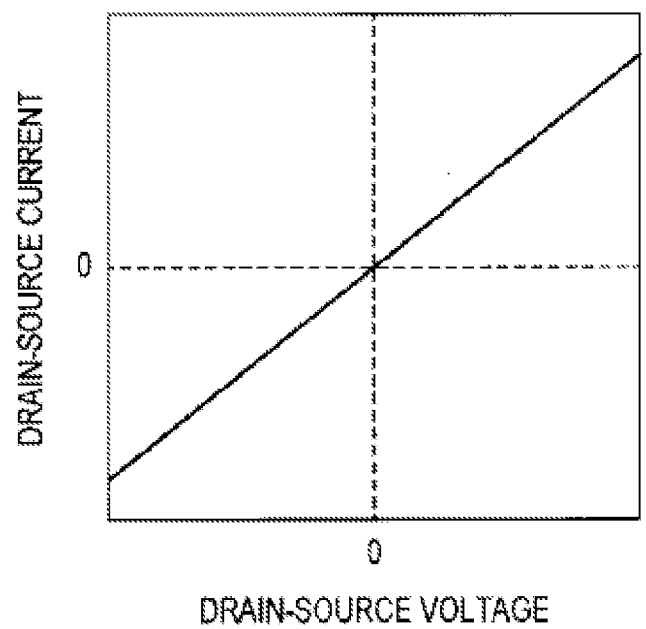
FIG. 7A shows a relationship between a drain-source voltage and a drain-source current.
Figure 7B:
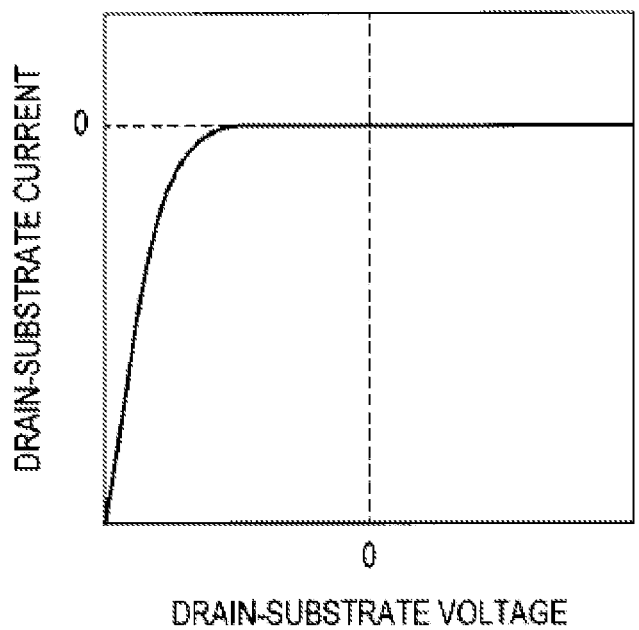
FIG. 7B shows a relationship between a drain-substrate voltage and a drain-substrate current.

FIG. 7A shows the current-voltage characteristics between the source and the drain of the memory transistor in the shorted state. The resistance between the source and drain in the shorted state is ohmic. FIG. 7B shows the current-voltage characteristics between the well (substrate) and the drain of the memory transistor in the shorted state. The rectifying property due to the PN junction remains between the well and the drain.

In the description above, as an example of voltage conditions that create a memory transistor in the shorted state, the case of applying the ground voltage to the well or of letting the well potential float are described. Another example of voltage conditions are described below referring to FIG. 4B and FIG. 5B.

As described above, in order to place the memory transistor in the erase state, as shown in FIG. 4A, the ground voltage may be applied to the control gate and a positive substrate voltage Vsub (e.g. 20 V) may be applied to the N type impurity regions (source and drain) and to the P type well. In the case of erasing the memory transistor utilizing this voltage condition, it is preferable to short the memory transistor under the voltage condition shown in FIG. 4B.

Figure 4B:
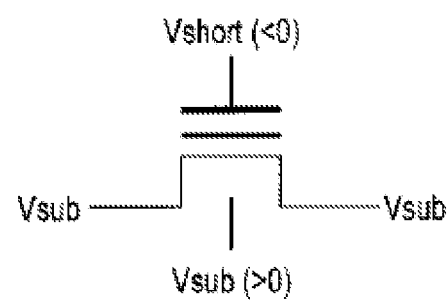
FIG. 4B is another example of a shorting method.

Under the conditions shown in FIG. 4B, a negative voltage Vshort is applied to the control gate of the memory transistor and a positive substrate voltage Vsub is applied to the N type impurity regions (source and drain) and to the P type well. Vsub is, for example, 20 V and this is equivalent to the voltage applied to the well to place the memory transistor in the erase state. Vshort, for example, is −5 V.

As another example, in order to change the memory transistor into the erase state, as shown in FIG. 5A, a negative voltage Verase (e.g. −10 V) is applied to the control gate and a positive substrate voltage Vsub (e.g. 10 V) is applied to the N type impurity regions (source and drain) and to the P type well. In the case of erasing the memory transistor using this voltage condition, it is preferable to short the memory transistor under the voltage condition shown in FIG. 5B.

Figure 5B:
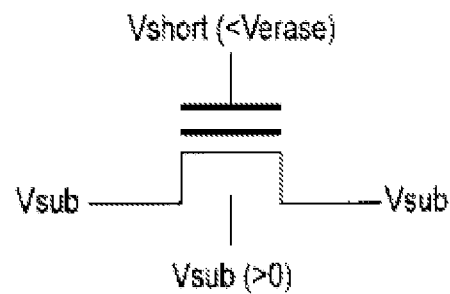
FIG. 5B is another example of a shorting method.

Under the condition shown in FIG. 5B, a negative voltage Vshort is applied to the control gate of the memory transistor and a positive substrate voltage Vsub is applied to the N type impurity regions (source and drain) and to the P type well. Vsub is, for example, 10 V and this is equivalent to the voltage applied to the well to change the memory transistor into the erase state. Vshort, for example, is −15 V.

In any of the examples of FIGS. 3A, 3B, 4A, 4B, 5A and 5B, Vshort is smaller than Verase. This example may be used to improve the stability of data stored in the memory transistor in a programmable logic device. A programmable logic device that stores circuit information in its flash memory has the characteristic that rewriting circuit information may be performed many times, but the period that data is retained in the flash memory is not infinite.

However, using the method in this example, a specific memory transistor may be set in the on state permanently. In other words, if information exists for which it is determined there will not be a need of rewriting (no later alterations will be made), a specific memory transistor may be shorted selectively, thus making the information unerasable.

Figure 20:
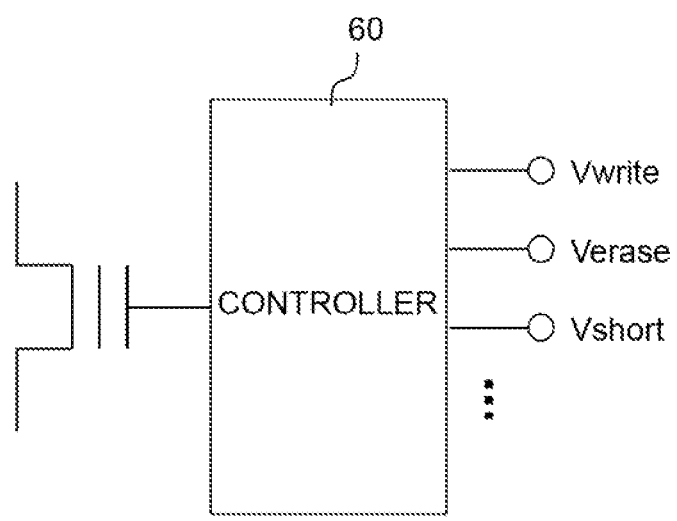
FIG. 20 shows a controller connected to a memory transistor.

The Vshort may be generated utilizing a voltage generation circuit in the chip where the memory transistor is formed, or it may be supplied from a power source in another chip. In either case, as shown in FIG. 20, a controller 60 is required to connect the control gate of the memory transistor to the Vshort as required.

The controller 60 has a role of selecting the voltage to be applied to the control gate of the memory transistor. For example, it applies selectively Vshort, Vwrite (write voltage) and Verase (erase voltage) to the control gate of the memory transistor.

The memory transistor that is not made to be shorted ideally stays normally in the off-state unless voltage is applied to the control gate electrode. Therefore, the voltage applied to the control gate of the memory transistor while the programmable logic device is in operation should be set lower than the threshold voltage in the erase state if the memory transistor is of the N type. Additionally, it is even more preferable, if it is manufactured in such a way that the threshold voltage is positive in the erase state of the memory transistor, because it is then possible to set the voltage applied to the control gate while the programmable logic device is in operation at 0 V.

In the example above, a method of making a memory transistor, as shown in FIG. 1A, into a shorted state is described. However, a transistor which does not include a charge storage film and one of the first and second insulating films, as shown in FIG. 1B, may be made into a shorted state in the same manner.

When a negative voltage is applied to the control gate of a transistor by a controller, the potential at the channel region is modulated to the negative direction by capacitive coupling between the control gate and the channel region. At this time, if a ground voltage is applied to the well, the potential at the channel region returns to the ground level but there is a period during this transition when the potential in the channel region becomes negative. During this period, if the ground voltage is applied to the source and drain of the transistor, then during the transitional period, bias in the reverse direction (reverse bias) is applied to the PN junction between the channel region and the source, or between the channel region and the drain.

Therefore, under the condition where a ground voltage is applied to the source and drain of the transistor, if a negative voltage Vshort is applied to the control gate, then PN junction of the channel region and source, or PN junction of the channel region and drain is broken. In this state, source and drain of the transistor are shorted electrically.

In the example described above, when the transistor is shorted by applying Vshort to the control gate, the ground voltage may be applied to the well, or the potential at the well may be made to float. However, when the potential at the well is made to float, then the potential in the channel region is modulated more efficiently and the absolute value of Vshort may be made smaller, which is preferable.

In the example described above, the case that the transistor is N type transistor which has N type source and drain in a P type well is considered. When the transistor is P type transistor which has P type source and drain in an N type well, a positive voltage may be used as Vshort. When the controller applies the positive Vshort to the control gate of the P type transistor, a ground voltage may be applied to the source region and the drain region to form a permanent conductive path between the source region and the drain region.

Specific examples of certain embodiments of a programmable logic device are described below.

The programmable logic device has multiple wirings inside and has a programmable logic switch to connect/disconnect wirings to each other selected from these multiple wirings. The programmable logic switch has one or more memories (memory units) and controls connection/disconnection of wirings based upon the information stored in memory (memory units).

The memory transistor shown in FIG. 1A may be utilized as a programmable logic switch. For example, in order to control the connection state of a wiring A and wiring B, the source of the memory transistor may be connected electrically to the wiring A and the drain of the memory transistor may be connected electrically to the wiring B.

The connection between the source of the memory transistor and the wiring A, or the connection between the drain of the memory transistor and the wiring B may be made directly, or may be done via an inverter or a buffer.

The wiring A and wiring B are connected or disconnected depending on the information stored in the memory transistor. If it is determined that this wiring will be used only in the connected state, the memory transistor can be set in the shorted state. When the memory transistor is set in the shorted state, for example, as shown in FIG. 3B, the ground voltage is applied to the source and the drain and Vshort is applied to the control gate. At this time, the ground voltage may be applied to the well of the memory transistor; the well may also be made to float. Or, as shown in FIG. 4B and FIG. 5B, the positive substrate voltage Vsub can be applied to the source, drain and well, when Vshort is applied to the control gate. Since the change to the shorted state is irreversible, there is no possibility that the wiring A and wiring B can change unexpectedly to the disconnected state.

Generally in the programmable logic devices, the control gates of the multiple memory transistors are connected to a common control wiring. Therefore, when shorting a selectively specified memory transistor, any unselected memory transistor, which is connected to the same control wiring as the specifically selected memory transistor, must be prevented from being inadvertently shorted.

The technique for doing this is to let the source and the drain of any unselected memory transistor to electrically float. Alternatively, a short-circuit inhibition voltage Vinhibit may be applied to the source and drain of the unselected memory transistor. Vinhibit is smaller than the voltage applied to the source and drain of the memory transistor to change the memory transistor into the shorted state. For example, in the case of shorting the memory transistor under the condition shown in FIG. 3B, Vinhibit is about −2 V. Similarly in the case of shorting the memory transistor under the condition shown in FIG. 4B and FIG. 5B, Vinhibit is, for example, 18 V and 8 V respectively.

Figure 8:
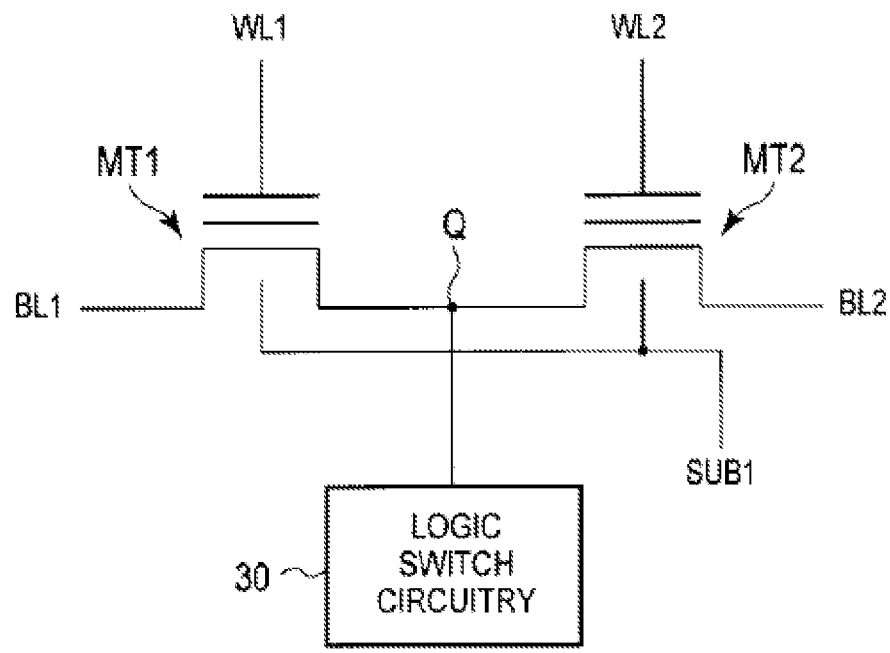
FIG. 8 depicts a memory unit in a programmable logic device according to an embodiment.

In another form of programmable logic switch, the method of this example may be used in the configuration shown in FIG. 8. The programmable logic device shown in FIG. 8 includes two memory transistors MT1 and MT2 connected in series and a logic circuit switch (logic switch circuitry) 30.

The control gate of the memory transistor MT1 is connected to a word line WL1, one of the two impurity regions (source and drain) is connected to a bit line BL1, and the other is connected to a node Q. The control gate of the memory transistor MT2 is connected to a word line WL2, one of the two impurity regions (source and drain) is connected to a bit line BL2, while the other is connected to the node Q. The node Q is connected to the logic switch circuitry 30.

The logic switch circuitry 30 controls the connection state of the wiring A and wiring B according to the data memorized (stored) in the memory transistors MT1 and MT2. The memory transistors MT1 and MT2 are formed in a common well, which is connected to a wiring SUB1.

When the programmable logic switch is in operation, one of the memory transistors MT1 and MT2 is set in the write state and the other in the erase state (complementary states). The operating voltage, which is larger than the threshold voltage of the memory transistor in the erase state, but smaller than the threshold voltage of the memory transistor in the write state, is applied to the word lines WL1 and WL2. At this time, the power source voltage is applied to one of the bit lines BL1 and BL2, and the ground voltage to the other. Thereby, the specified voltage (e.g. power source voltage, or ground voltage) is transferred from the bit lines BL1 or BL2, through one of the memory transistors MT1 and MT2 in the erase state to the logic switch circuitry 30.

Figure 9:
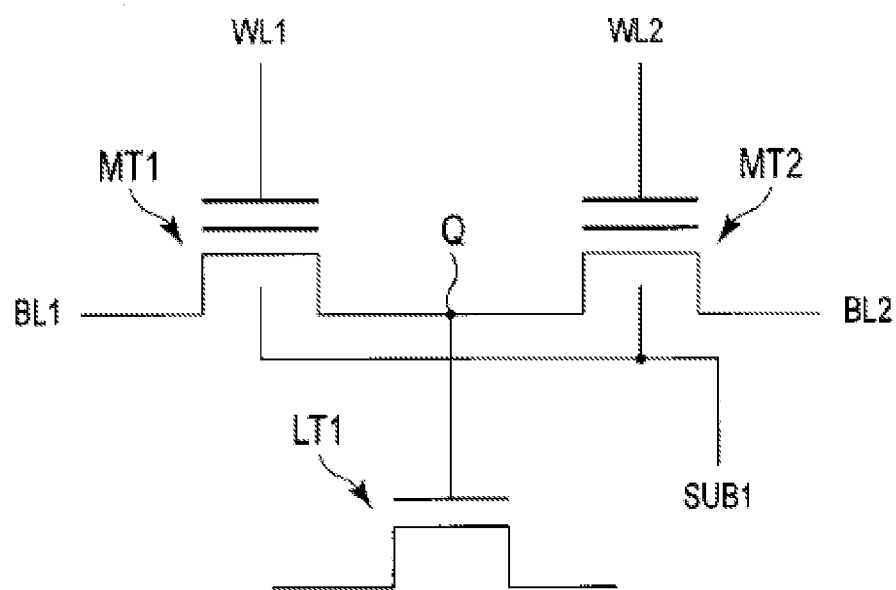
FIG. 9 depicts a memory unit in a programmable logic device according to an embodiment.
Figure 10:
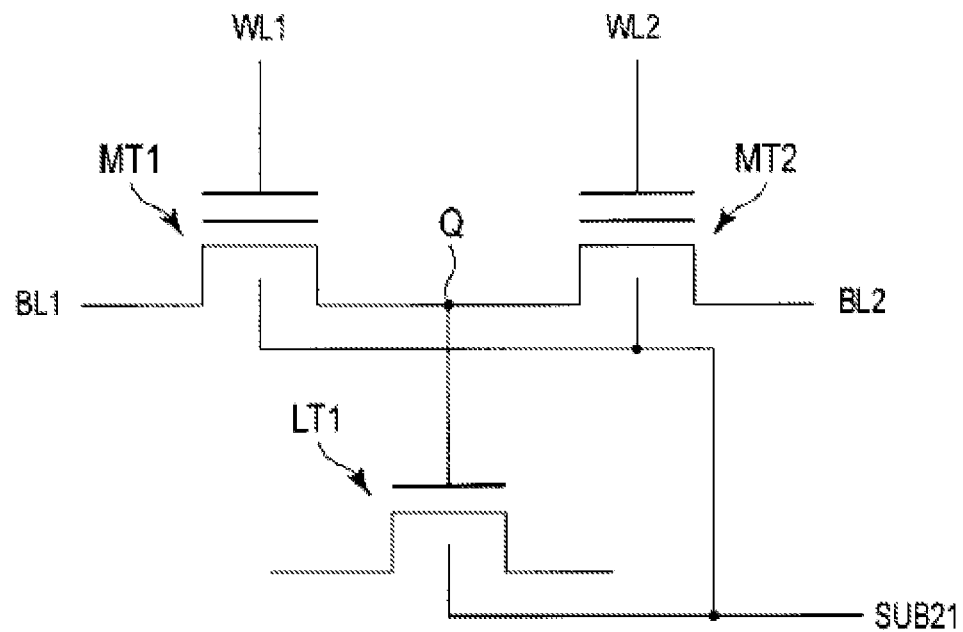
FIG. 10 depicts an embodiment of a programmable logic device.

In a simple example of the logic switch circuitry 30, a logic transistor LT1 may be used as shown in FIG. 9. A gate of the logic transistor LT1 is connected to the node Q. Also, as shown in FIG. 10, the memory transistors MT1 and MT2 and the logic transistor LT1 may be formed in a common well. In this case, the common well is connected to a wiring SUB21.

The method of selectively setting the memory transistor MT1 in the shorted state in the programmable logic switch with the structure shown in FIG. 10 is described below.

Figure 11:
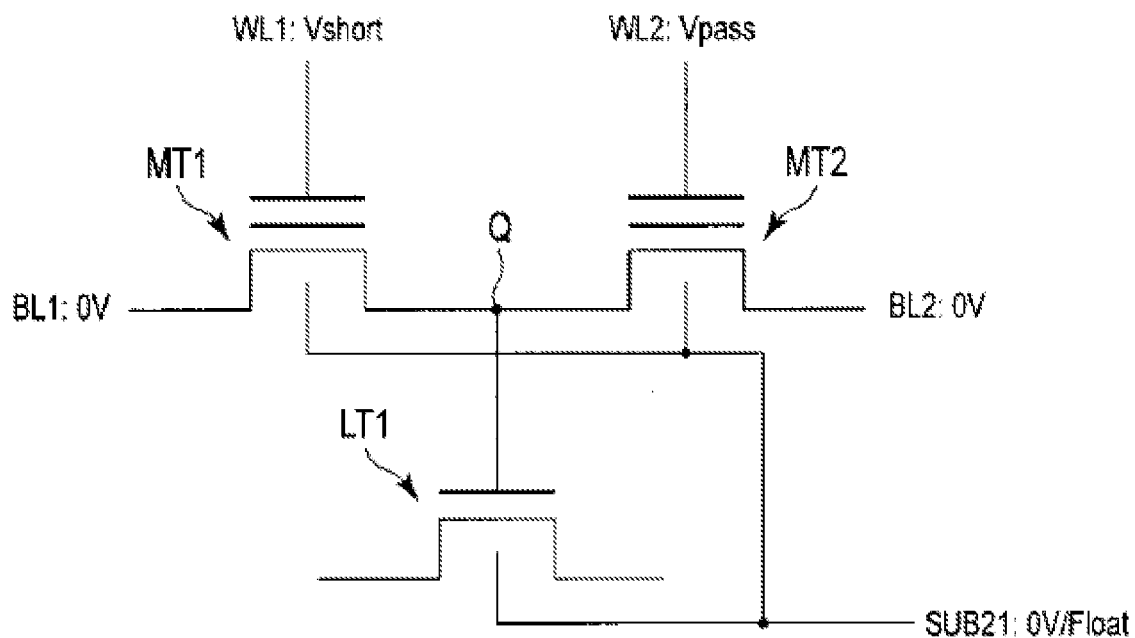
FIG. 11 depicts a short-circuiting method applied to a memory unit in a programmable logic device.

A first example of applying voltage to achieve this is shown in FIG. 11. Vshort is applied to the control gate of the memory transistor MT1, the ground voltage is applied to the bit lines BL1 and BL2. A pass voltage (Vpass), which is larger than the threshold voltage of the memory transistor MT2, is applied to the control gate of the memory transistor MT2. Vshort is, for example, −25 V and Vpass is, for example, 10 V. The ground voltage is applied to the wiring SUB21 or SUB21 is left electrically to float.

At this time, since the memory transistor MT2 is in the on-state, the ground voltage is applied to the node Q through the memory transistor MT2. Thus, the memory transistor MT1 is made in the shorted state but, since Vshort is not applied to the word line WL2, the memory transistor MT2 is not made in the shorted state. Also, since the voltage applied to the gate of the logic transistor LT1 is the ground voltage, deterioration or destruction of the logic transistor LT1 does not occur.

Figure 12:
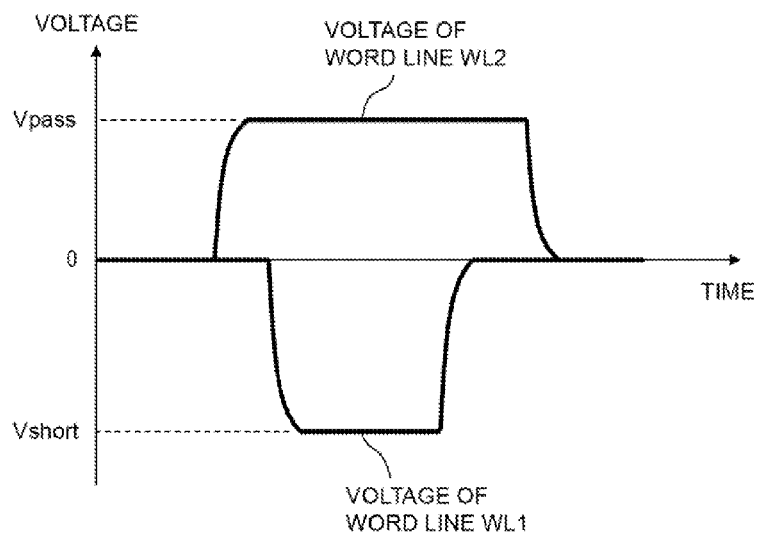
FIG. 12 is a wave form diagram showing a timing of voltage application to a programmable logic device.

Here, as shown in FIG. 12, the timing of applying Vpass is preferably before Vshort is applied. This is because if Vshort is applied to the word line WL1 when the memory transistor MT2 is in the off-state, the potential in the channel region of the memory transistor MT1 is modulated to the negative direction and at the same time, the potential of the node Q may be also modulated. In this case, a large voltage is applied to the gate of the logic transistor LT1 and the gate insulating film may be destroyed.

For similar reasons, the timing of finishing Vpass application is preferably after Vshort is applied as shown in FIG. 12.

In the programmable logic switch with the structure shown in FIG. 10, as another example of the voltage conditions to selectively set the memory transistor MT1 in the shorted state, the positive substrate voltage Vsub may be applied to the wiring SUB21. In this case, each of the voltages applied to the word lines WL1 and WL2, bit lines BL1 and BL2 is set at a value greater than the value of the previously described first example by Vsub.

Figure 13A:
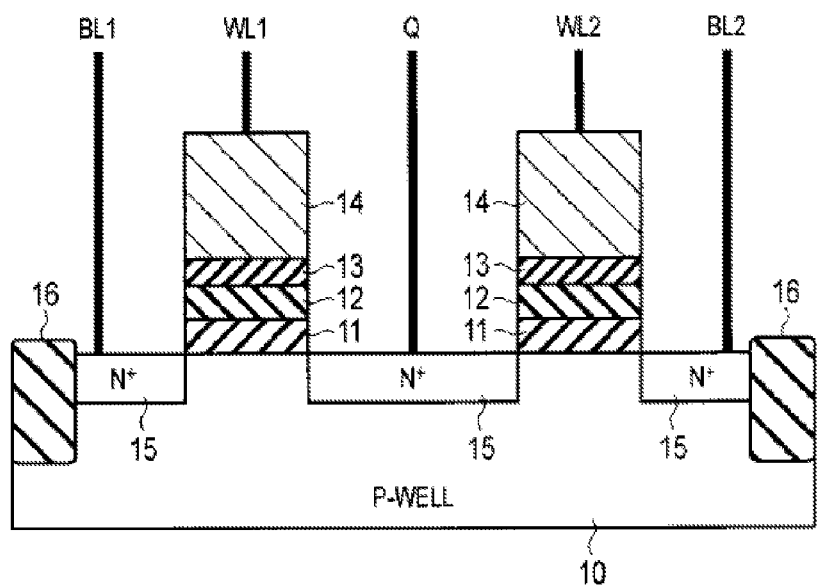
FIG. 13A is a cross-section of non-volatile memory transistors in a programmable logic device according to an embodiment.
Figure 13B:
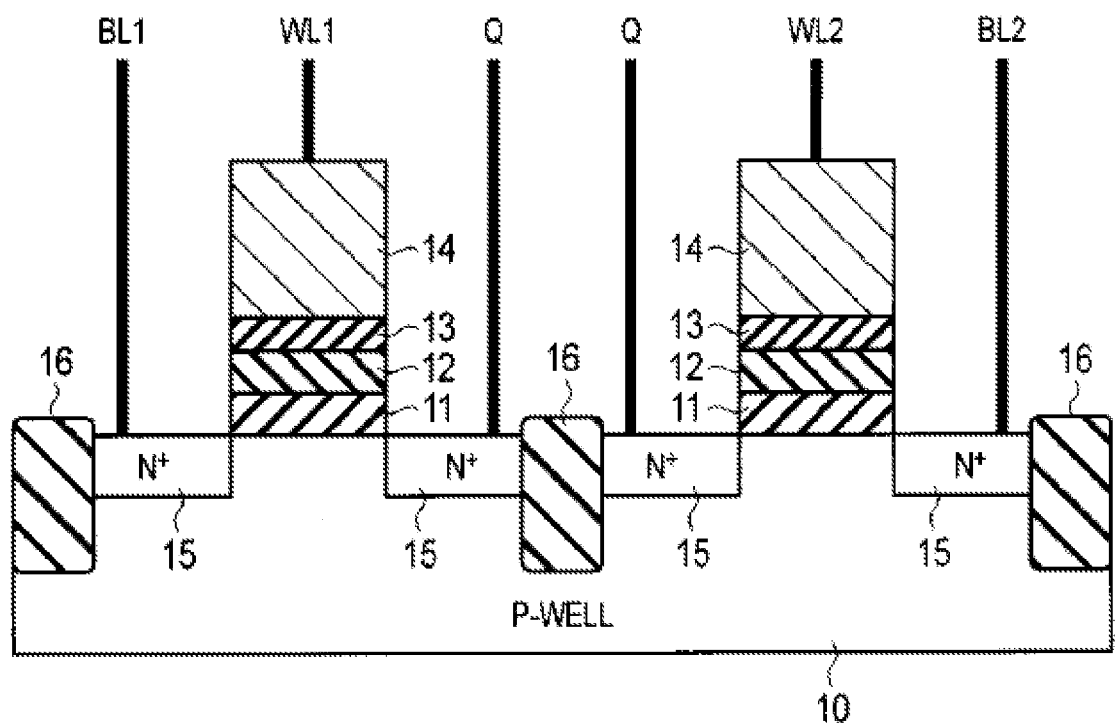
FIG. 13B is a cross-section of non-volatile memory transistors in a programmable logic device according to an embodiment including a shallow trench isolation element.

FIG. 13A and FIG. 13B are cross-sectional view showing schematically a layout of the memory transistors MT1 and MT2 in FIG. 8 to FIG. 11. In FIG. 13A and FIG. 13B, for elements corresponding to those in FIG. 8 to FIG. 11, the same symbols are used as those in FIG. 8 to FIG. 11.

A device isolation region 16 such as Shallow Trench Isolation (STI) is formed in the P type well 10 (or semiconductor substrate). The P type well 10 surrounded by a device isolation region becomes active region. The memory transistors MT1 and MT2 have the two impurity regions (source and drain) 15.

Each of the memory transistors MT1 and MT2 includes the first insulating film 11 on the channel region between the N type impurity regions 15 in the P type well 10, the charge storage film 12 on the first insulating film 11, the second insulating film 13 on the charge storage film 12, and the control gate 14 on the second insulating film 13.

One of two N type impurity regions of the memory transistor MT1 is connected to the bit line BL1 and one of two N type impurity regions of the memory transistor MT2 is connected to the bit line BL2. The control gate 14 of the memory transistor MT1 is connected to the word line WL1 and the control gate 14 of the memory transistor MT2 is connected to the word line WL2.

In the structure shown in FIG. 13A, the memory transistors MT1 and MT2 are both arranged within an active region. In this case, the other one of two N type impurity regions of the memory transistor MT1 and the other one of two N type impurity regions of the memory transistor MT2 are commonly shared and connected to the node Q.

In the structure shown in FIG. 13B, the memory transistors MT1 and MT2 are arranged within mutually different active regions. In this case, the other one of two N type impurity regions of the memory transistor MT1 and the other one of two N type impurity regions of the memory transistor MT2 are independent from each other, but are commonly connected to the node Q.

The structures shown in FIG. 13A and FIG. 13B are equivalent in circuit. However, when one of the two memory transistors MT1 and MT2 is placed in the shorted state using the method in this example, it is preferable, as shown in FIG. 13B, that the two memory transistors MT1 and MT2 are formed in mutually different active regions because, by setting the device isolation region 16 between the two memory transistors MT1 and MT2, it may be prevented with certainty that both memory transistors are unexpectedly made in the shorted state.

The next case to be considered is an array that is composed of the programmable logic switch in FIG. 8 and FIG. 11, that is, in which the control gate of the memory transistor within one programmable logic switch and the control gate of the memory transistor within another programmable logic switch are connected to a common word line.

Figure 14:
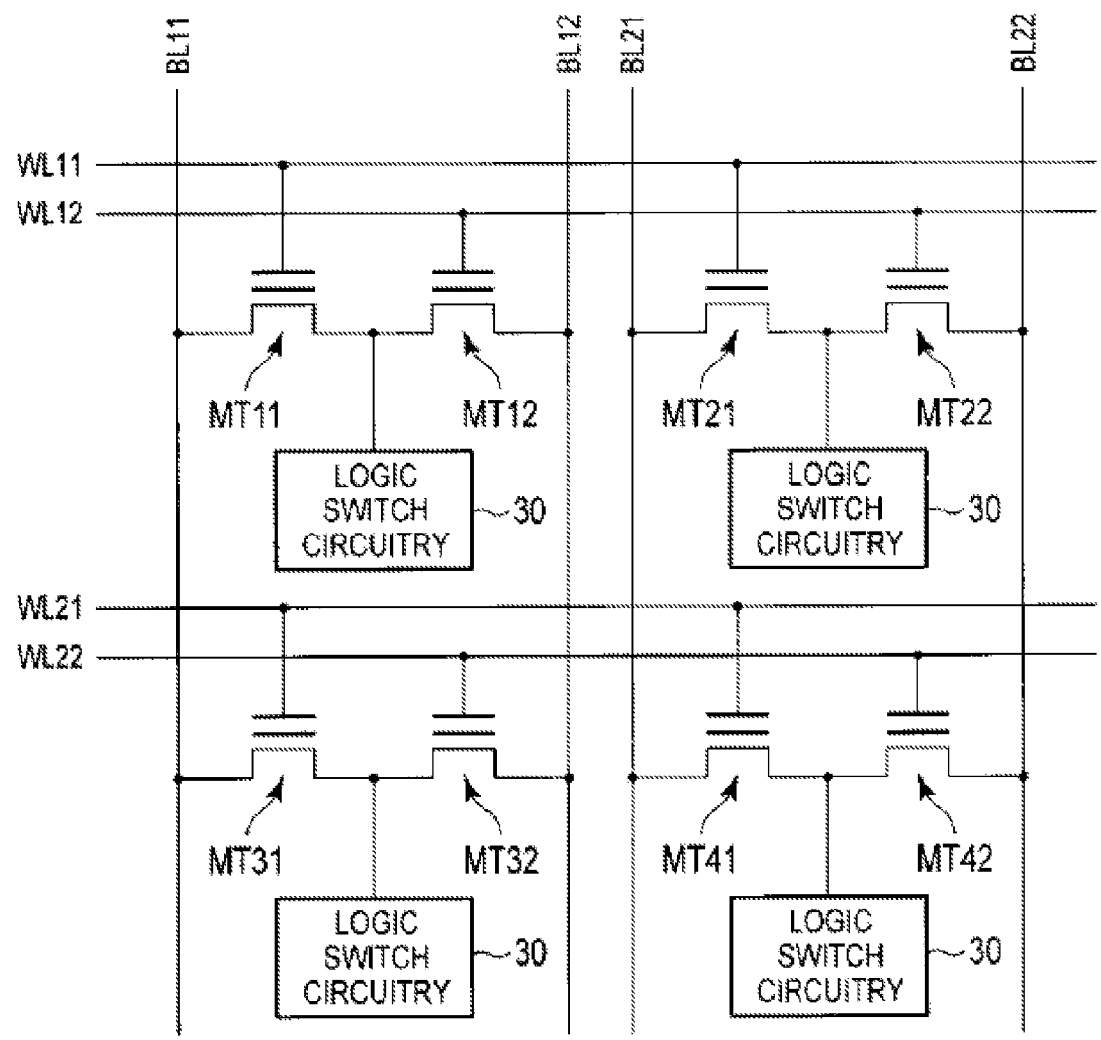
FIG. 14 shows an array of programmable logic device switches according to an embodiment.

FIG. 14 shows a situation when an array is composed of the programmable logic switch (FIG. 8). In this figure, for simplification, an array with four programmable logic switches is shown. One programmable logic switch includes, as it has been described, two memory transistors and the logic switch circuitry 30.

The control gates of memory transistors MT11 and MT21 are connected commonly to a word line WL11 and the control gates of memory transistors MT12 and MT22 are connected commonly to a word line WL12. The control gates of the memory transistors MT31 and MT41 are connected commonly to a word line WL21 and the control gates of the memory transistors MT32 and MT42 are connected commonly to a word line WL22.

One of two impurity regions of the memory transistors MT11 and MT31 is commonly connected to a bit line BL11 and one of the two impurity regions of the memory transistors MT12 and MT32 is commonly connected to a bit line BL12. One of two impurity regions of the memory transistors MT21 and MT41 is commonly connected to a bit line BL21 and one of two impurity regions of the memory transistors MT22 and MT42 is commonly connected to a bit line BL22.

Figure 15:
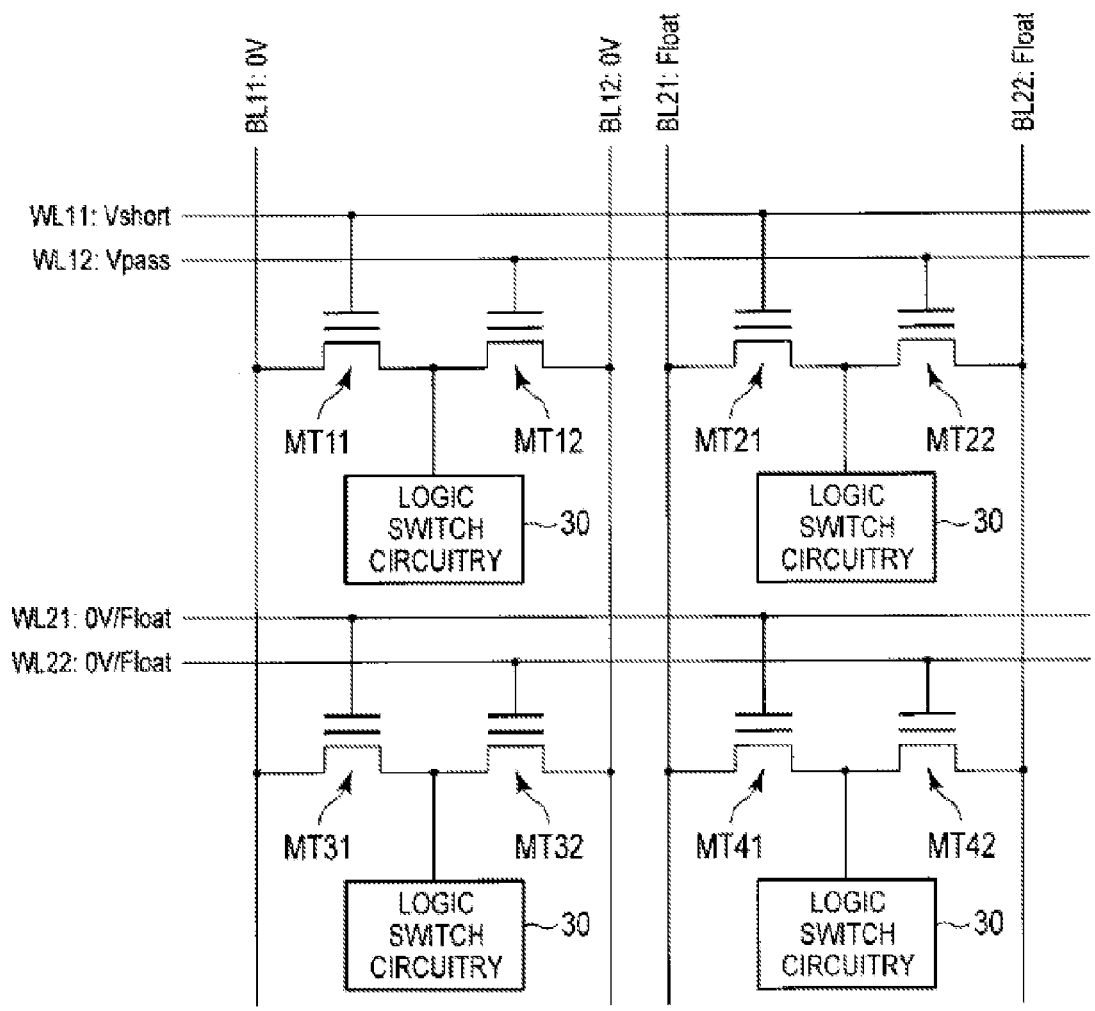
FIG. 15 depicts a short-circuiting method applied to a memory unit in the array of the programmable logic device switches.

FIG. 15 shows a first example of voltage conditions to place selectively only the memory transistor MT11 in the shorted state in the array of the programmable logic switch shown in FIG. 14.

Vshort is applied to the word line WL11 and Vpass is applied to the word line WL12. Vshort is, for example, −25 V and Vpass is, for example, 10 V. The ground voltage is applied to the bit lines BL11 and BL12. On the other hand, the bit lines BL21 and BL22 are left to electrically float. The ground voltage may be applied to the word lines WL21 and WL22, or they may be left to float.

The ground voltage may be applied to the well of the memory transistor MT11, or it may be left to float.

At this time, Vshort is applied to the gate of the memory transistor MT21, but two impurity regions (source and drain) are electrically floating and thus the memory transistor MT21 may not be in the shorted state.

As another example of voltage conditions shown in FIG. 15, the positive substrate voltage Vsub may be applied to the well of the memory transistor MT11. In this case, each of the voltages applied to the word lines WL11 and WL12 and bit lines BL11 and BL12 is set at a value greater than the value of the previously described first example by Vsub.

Figure 16:
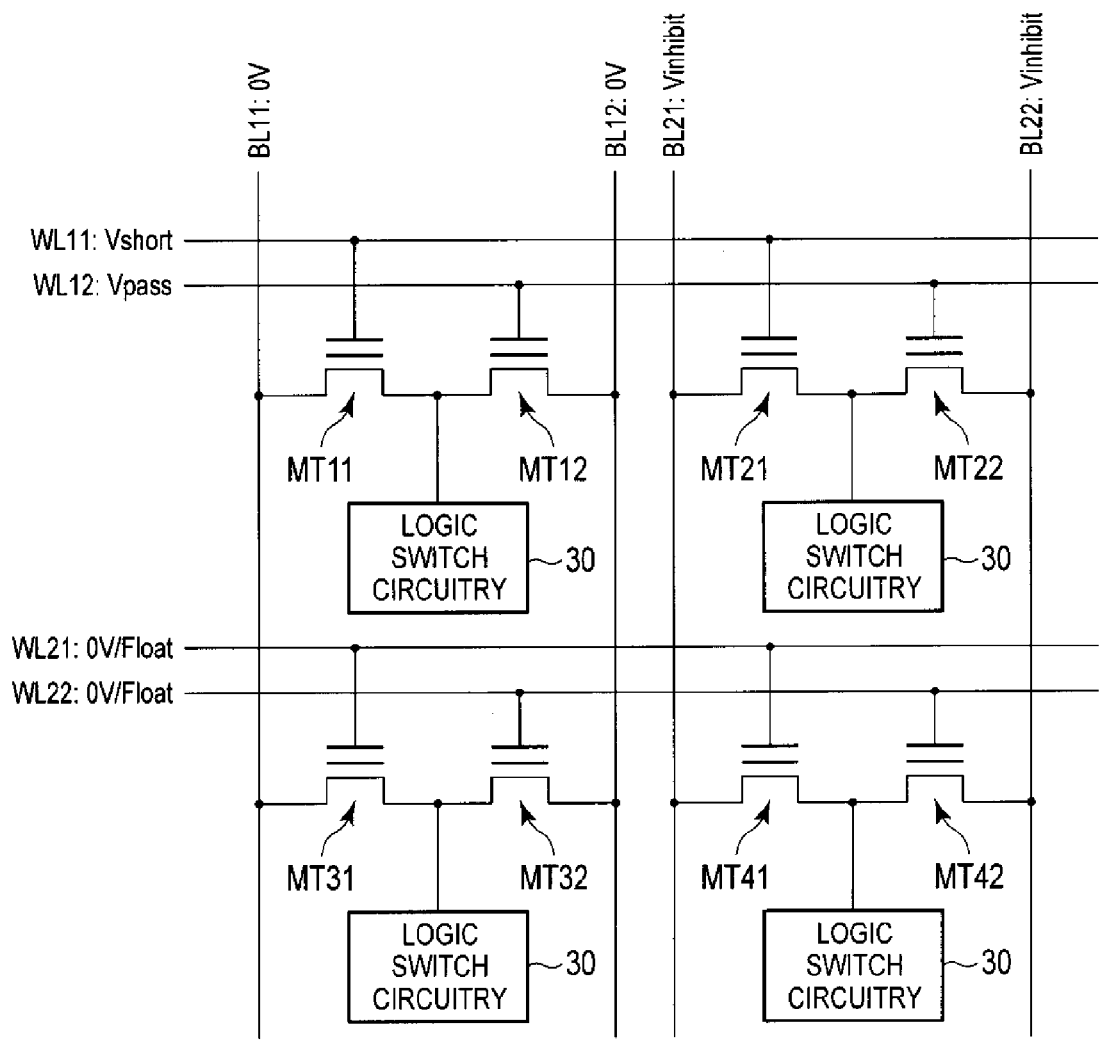
FIG. 16 depicts a short-circuiting method applied to a memory unit in the array of the programmable logic device switches.

FIG. 16 shows a second example of voltage conditions to place only the memory transistor MT11 in the shorted state in the array of the programmable logic switch shown in FIG. 14.

Vshort is applied to the word line WL11 and Vpass is applied to the word line WL12. Vshort is, for example, −25 V and Vpass is, for example, 10 V. The ground voltage is applied to the bit lines BL11 and BL12. On the other hand, a short-circuit inhibition voltage Vinhibit is applied to the bit lines BL21 and BL22. Vinhibit is a smaller voltage than the voltage applied to the bit lines BL11 and BL12. For example it is −2 V. The ground voltage may be applied to the word lines WL21 and WL22, or they may be left to float.

The ground voltage may be applied to the well of the memory transistor MT11, or it may be left to float.

At this time, Vshort is applied to the gate of the memory transistor MT21, but Vinhibit, as a short-circuit inhibition voltage, is applied to two impurity regions (source and drain) and thus the memory transistor MT21 may not be in the shorted state.

As another example of the voltage conditions shown in FIG. 16, the positive substrate voltage Vsub may be applied to the well of the memory transistor MT11. In this case, each of the voltages applied to the word lines WL11 and WL12 and bit lines BL11 and BL12, BL21 and BL22 is set at the value greater than the value of the previously described second example by Vsub.

In the first and second examples described above, the voltage at a contact point of the memory transistor MT21 and memory transistor MT22 while a voltage is applied to each wiring is considered.

In the first example, the contact point is electrically floating and thus the potential is the one modulated by Vshort or Vpass. The amount of this modulation varies depending on the capacitance between the two impurity regions (source and drain) at the memory transistors MT21 and MT22 and the control gates. If the amount of modulation is too large, the characteristics of the logic switch circuitry 30 may deteriorate. Therefore, this capacitance needs to be strictly controlled.

On the other hand, in the second example, the voltage at the contact point is fixed by Vinhibit. Therefore, there is merit in that control of the aforementioned capacitance is not needed.

Figure 17:
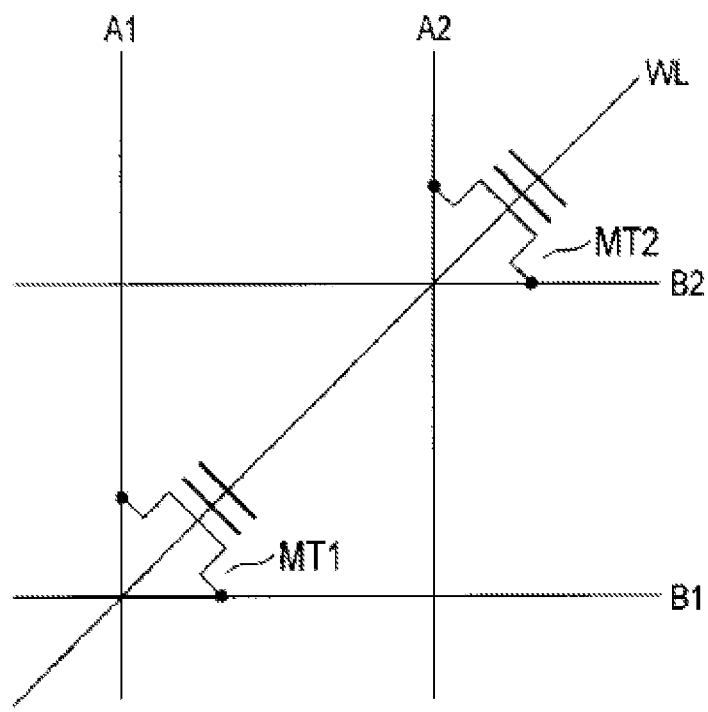
FIG. 17 shows an array of the programmable logic device switches according to an embodiment.

FIG. 17 shows another example of the array of the programmable logic switch. In this figure, for simplification, the array with two programmable logic switches is shown. In this example, each programmable logic switch includes one memory transistor.

The two impurity regions (source and drain) of the memory transistor MT1 are connected to a wiring A1 and a wiring B1 and the two impurity regions (source and drain) of the memory transistor MT2 are connected to a wiring A2 and a wiring B2. Also, the control gates of the two memory transistors MT1 and MT2 are commonly connected to a word line WL.

Also, based on the information stored in the memory transistor MT1, the wiring A1 and the wiring B1 are connected/disconnected; and based on the information stored in the memory transistor MT2, the wiring A2 and the wiring B2 are connected/disconnected.

Figure 18:
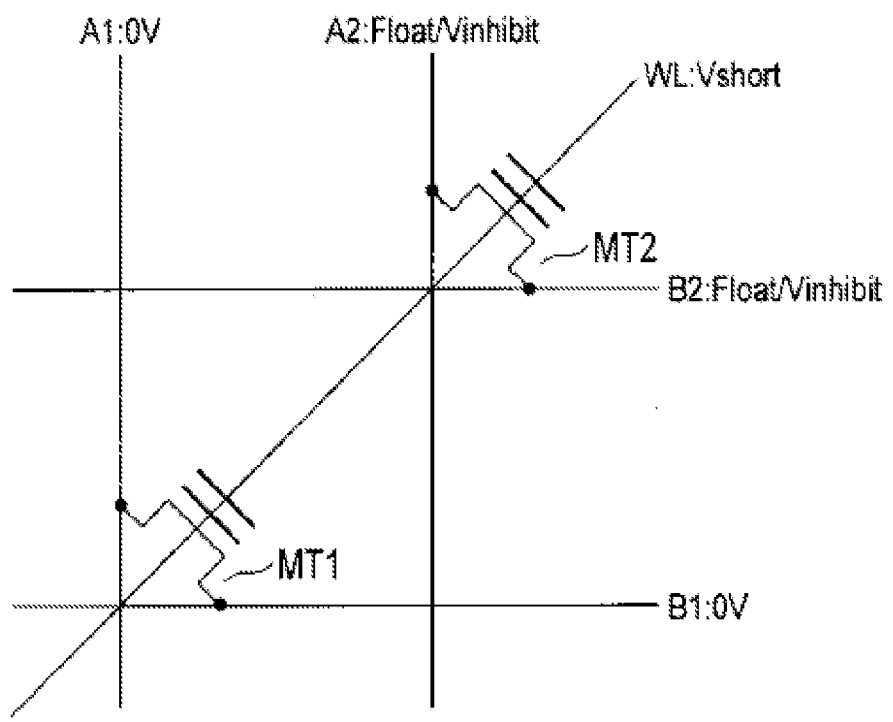
FIG. 18 depicts a short-circuiting method applied to a memory unit in the array of the programmable logic device switches.

FIG. 18 shows an example of conditions to selectively place only the memory transistor MT1 in the shorted state in the array of the programmable logic switch shown in FIG. 17.

Vshort is applied to the word line WL. Vshort is, for example, −25 V. The ground voltage is applied to the wiring A1 and the wiring B1. On the other hand, the wiring A2 and the wiring B2 are left to electrically float, or Vinhibit as short-circuit inhibition voltage is applied. Vinhibit is a voltage smaller than the voltage applied to the wiring A1 and wiring B1 and is, for example, −2 V.

The ground voltage may be applied to the well of the memory transistor MT1, or it may be left to float.

At this time, Vshort is applied to the gate of the memory transistor MT2, but the two impurity regions (source and drain) of MT2 are allowed to electrically float or Vinhibit as short-circuit inhibition voltage is applied, and thus, the memory transistor MT2 may not be in the shorted state.

As another example of voltage conditions shown in FIG. 18, the positive substrate voltage Vsub may be applied to the well of the memory transistor MT1. In this case, each of the voltages applied to the word lines WL and the wirings A1 and B1 is set at a value greater than the value of previously described example by Vsub. Also, when Vinhibit is applied to the wirings A2 and B2, this value is also set at a value greater than the value of the previously described example by Vsub.

When setting the memory transistor in the shorted state using the method in this example, a current larger than that used when general writing or erasing operations are performed may be generated. For this reason, it is preferable that a system is added to the device to stop voltage application detecting when the memory transistor is being placed in the shorted state.

Figure 19:
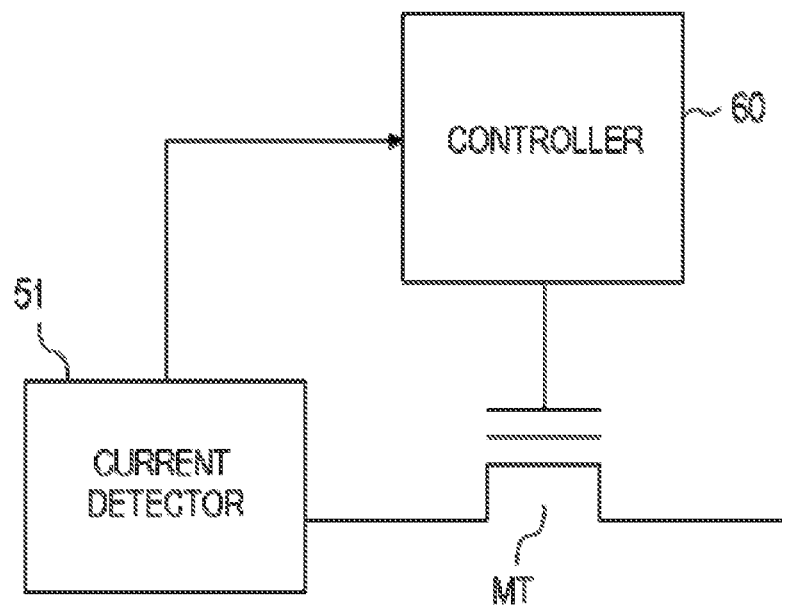
FIG. 19 depicts a control circuit for controlling the short-circuiting of the source and the drain of a memory transistor.

FIG. 19 shows schematically an example of systems that stop voltage application. When the memory transistor MT switches to the shorted state, each of the currents that flows at the source and at the drain changes drastically. A current detector 51 to monitor one or both these currents is installed. When the current detector 51 detects a change in current, the information is sent to a controller 60. Based on this information, the controller 60 determines the supply/shutoff of Vshort applied to the control gate of the memory transistor.

Example

FIG. 21 through FIG. 24 show an example of FPGA as an application example.

Figure 21:
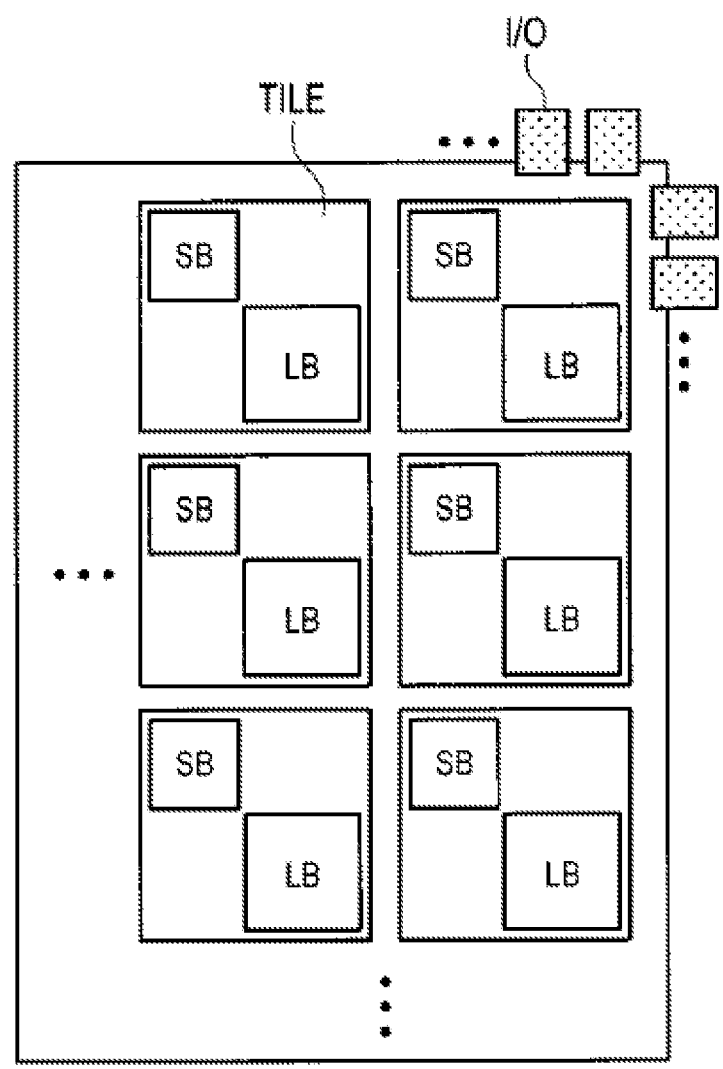
FIG. 21 depicts an FPGA layout incorporating tiles with a memory according to an embodiment.

FPGA in this example has, as shown in FIG. 21, a tile area having tiles arranged in an array and an I/O area arranged around the tiles.

Figure 22:
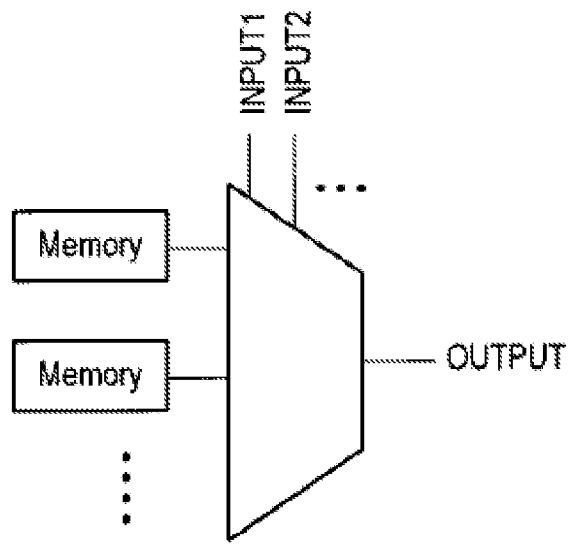
FIG. 22 depicts the FPGA incorporating memory units within a tile according to an embodiment.
Figure 23:
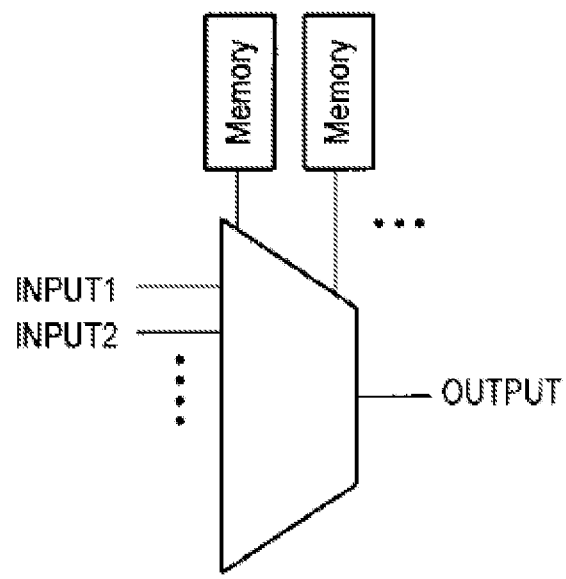
FIG. 23 depicts the FPGA incorporating memory units within a tile according to an embodiment.
Figure 24:
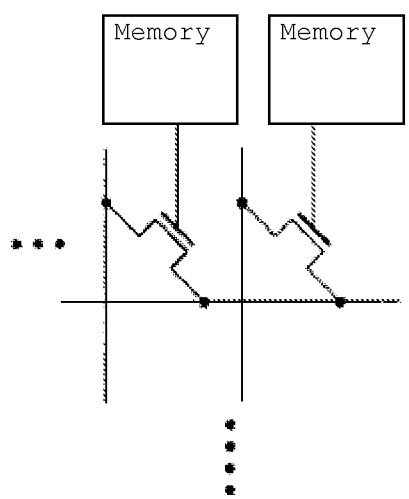
FIG. 24 depicts the FPGA incorporating memory units within a tile according to an embodiment.

Each tile includes a logic block LB that can provide basic logical function and a switch block SB that determines connection/disconnection of the logic block LB. As shown in FIG. 22 through FIG. 24 the circuits comprising the logic block LB or switch block SB includes memory (memory units). Logic that is realized by FPGA may be changed by rewriting the data stored in this memory, thereby reconfiguring the FPGA.

In conventional FPGA, the memory shown in FIG. 22 through FIG. 24 is, for example, SRAM. But, with FPGA in this example, at least one of the memories shown in FIG. 22 through FIG. 24 includes, for example, a nonvolatile memory transistor (flash memory) with a structure as shown in FIG. 1A.

Modification of logic (selection of signal passage) is executed based on the data stored in these nonvolatile memory transistors. Also, according to this example, logic (circuit information) may be fixed as needed and operation of the circuit from thereon may be stabilized.

While certain examples have been described, these have been presented by way of example only and are not intended to limit the scope of the inventions. Indeed, the novel examples described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit, comprising:
   a plurality of transistors including a first transistor, each of the transistors being a memory transistor formed in a well of a first conductivity type and including:
      a source region of a second conductivity type disposed in the well, the second conductivity type different from the first conductivity type;
      a drain region of the second conductivity type disposed in the well;
      a channel region disposed between the source region and the drain region;
      a first insulating film disposed on the channel region;
      a charge storage film disposed on the first insulating film;
      a second insulating film disposed on the charge storage film; and
      a control gate electrode disposed on the second insulating film; and
   a controller configured to apply a first voltage to the control gate electrode of the first transistor while a second voltage is applied to the source region and the drain region of the first transistor, the first voltage forming a permanent conductive path between the source region and the drain region of the first transistor placing the first transistor in a shorted state;
   the controller configured to apply a third voltage to the control gate electrode of the first transistor, the third voltage placing the first transistor in an erase state.

2. The semiconductor integrated circuit of claim 1, wherein the second voltage is greater than the first voltage when the first conductivity type is P type and the second conductivity type is N type, or the second voltage is smaller than the first voltage when the first conductivity type is N type and the second conductivity type is P type.

3. The semiconductor integrated circuit of claim 1, wherein the first voltage is smaller than the third voltage when the first conductivity type is P type and the second conductivity type is N type, or the first voltage is greater than the third voltage when the first conductivity type is N type and the second conductivity type is P type.

4. The semiconductor integrated circuit of claim 1,
wherein the well of the first transistor is allowed to electrically float when the controller applies the first voltage to the control gate electrode of the first transistor.

5. The semiconductor integrated circuit of claim 1,
wherein threshold voltage of the first transistor in the erase state is greater than 0V when the first conductivity type is P type and the second conductivity type is N type, or threshold voltage of the first transistor in the erase state is smaller than 0V when the first conductivity type is N type and the second conductivity type is P type.

6. The semiconductor integrated circuit of claim 1, further comprising:
a plurality of wirings including:
a first wiring electrically connected to the source region of the first transistor; and
a second wiring electrically connected to the drain region of the first transistor;
wherein the first wiring and the second wiring are connected/disconnected based on information stored in the first transistor.

7. The semiconductor integrated circuit of claim 1,
wherein the plurality of transistors further comprise a second transistor, the control gate electrode of the second transistor being electrically connected to the control gate electrode of the first transistor; and
when the controller applies the first voltage to the control gate electrode of the first transistor, the source region and the drain region of the second transistor are allowed to electrically float to inhibit a permanent conductive path from forming between the source region and the drain region of the second transistor.

8. The semiconductor integrated circuit of claim 1,
wherein the plurality of transistors further comprise a second transistor, the control gate electrode of the second transistor being electrically connected to the control gate electrode of the first transistor; and
when the controller applies the first voltage to the control gate electrode of the first transistor, a fourth voltage is applied to the source region and the drain region of the second transistor to inhibit a permanent conductive path from forming between the source region and the drain region of the second transistor, the fourth voltage being a value between the first voltage and second voltage.

9. The semiconductor integrated circuit of claim 1, further comprising:
a plurality of wirings including a first wiring, a second wiring, and a third wiring; and
a first logic switch circuit including at least one logic transistor,
wherein the plurality of transistors further comprise a second transistor;
the third wiring electrically connected to the first logic switch circuit, one of the source and drain regions of the first transistor, and one of the source and drain regions of the second transistor; and
the first logic switch circuit connects/disconnects the first wiring and the second wiring based on information stored in the first and second transistors.

10. The semiconductor integrated circuit of claim 9,
wherein the first transistor is arranged in a first active area; and
the second transistor is arranged in a second active area, the second active area is different from the first active area.

11. The semiconductor integrated circuit of claim 9,
wherein when the controller applies the first voltage to the control gate electrode of the first transistor, a pass voltage is applied to the control gate electrode of the second transistor, the pass voltage making the second transistor on-state.

12. The semiconductor integrated circuit of claim 11, further comprising:
a second logic switch circuit including at least one logic transistor; and
a fourth wiring,
wherein the plurality of transistors further comprise a third transistor and a fourth transistor;
the fourth wiring electrically connected to the second logic switch circuit, one of the source and drain regions of the third transistor, and one of the source and drain regions of the fourth transistor;
the control gate electrode of the first transistor is electrically connected to the control gate electrode of the third transistor;
the control gate electrode of the second transistor is electrically connected to the control gate electrode of the fourth transistor; and
when the controller applies the first voltage to the control gate electrode of the first transistor, the source and drain regions of the third and fourth transistors are allowed to electrically float to inhibit a permanent conductive path from forming between the source region and the drain region of the third and fourth transistors.

13. The semiconductor integrated circuit of claim 11, further comprising:
a second logic switch circuit including at least one logic transistor; and
a fourth wiring,
wherein the plurality of transistors further comprise a third transistor and a fourth transistor;
the fourth wiring electrically connected to the second logic switch circuit, one of the source and drain regions of the third transistor, and one of the source and drain regions of the fourth transistor;
the control gate electrode of the first transistor is electrically connected to the control gate electrode of the third transistor;
the control gate electrode of the second transistor is electrically connected to the control gate electrode of the fourth transistor; and
when the controller applies the first voltage to the control gate electrode of the first transistor, a fourth voltage is applied to the source and drain regions of the third and fourth transistors to inhibit a permanent conductive path from forming between the source region and the drain region of the third and fourth transistors.

14. A semiconductor integrated circuit, comprising:
a plurality of transistors including a first transistor and a second transistor, each of the transistors being a memory transistor formed in a well of a first conductivity type and including:
a source region of a second conductivity type disposed in the well, the second conductivity type different from the first conductivity type;
a drain region of the second conductivity type disposed in the well;
a channel region disposed between the source region and the drain region;
a first insulating film disposed on the channel region;
a charge storage film disposed on the first insulating film;
a second insulating film disposed on the charge storage film; and a control gate electrode disposed on the second insulating film; and a controller configured to apply a first voltage to the control gate electrode of the first transistor while a second voltage is applied to the source region and the drain region of the first transistor, the first voltage forming a permanent conductive path between the source region and the drain region of the first transistor placing the first transistor in a shorted state;

the controller configured to apply a third voltage to the control gate electrode of the second transistor, the third voltage placing the second transistor in an erase state.

* * * * *